(12) United States Patent
Huang et al.

(10) Patent No.: US 6,995,428 B2
(45) Date of Patent: Feb. 7, 2006

(54) HIGH VOLTAGE LDMOS TRANSISTOR HAVING AN ISOLATED STRUCTURE

(75) Inventors: Chih-Feng Huang, Jhubei (TW);
Ta-yung Yang, Milpitas, CA (US);
Jenn-yu G. Lin, Taipei (TW);
Tuo-Hsin Chien, Tucheng (TW)

(73) Assignee: System General Corp., Taipei Hsien (TW)

( * ) Notice: Subject to any disclaimer, the term of this patent is extended or adjusted under 35 U.S.C. 154(b) by 0 days.

(21) Appl. No.: 10/786,703

(22) Filed: Feb. 24, 2004

(65) Prior Publication Data
US 2005/0184338 A1 Aug. 25, 2005

(51) Int. Cl.
*H01L 29/76* (2006.01)
(52) U.S. Cl. .................. 257/345; 257/213; 257/288; 257/327
(58) Field of Classification Search ............... 257/335, 257/336, 337, 338, 339, 340, 341, 342, 343

See application file for complete search history.

(56) References Cited

U.S. PATENT DOCUMENTS 6,448,625 B1 * 9/2002 Hossain et al.

OTHER PUBLICATIONS

Tsui et al., "Integration of power LDMOS into low-voltage 0.5 μm BiCMOS technology," International Electron Devices Meeting 1992, Technical Digest, p. 27-30.*

* cited by examiner

*Primary Examiner*—Nathan J. Flynn
*Assistant Examiner*—Kevin Quinto
(74) *Attorney, Agent, or Firm*—J.C. Patents

(57) ABSTRACT

A high voltage LDMOS transistor according to the present invention includes a P-field and divided P-fields in an extended drain region of a N-well. The P-field and divided P-fields form junction-fields in the N-well, in which a drift region is fully depleted before breakdown occurs. Therefore, a higher breakdown voltage is achieved and a higher doping density of the N-well is allowed. Higher doping density can effectively reduce the on-resistance of the LDMOS transistor. Furthermore, the N-well generated beneath a source diffusion region provides a low-impedance path for a source region, which restrict the transistor current flow in between a drain region and a source region.

12 Claims, 4 Drawing Sheets

HIGH VOLTAGE LDMOS TRANSISTOR HAVING AN ISOLATED STRUCTURE

BACKGROUND OF THE INVENTION

1. Field of Invention

The present invention relates to semiconductor devices, and more particularly to a lateral power MOSFET.

2. Description of Related Art

The development of single chip processes for integrating power switches with control circuitry is a major trend in the field of power IC development. The LDMOS (lateral double diffusion MOS) process in particular is currently being applied to manufacture monolithic ICs. The LDMOS process involves performing planar diffusion on the surface of a semiconductor substrate to form a main current path oriented in the lateral direction. Since the lateral MOSFET is manufactured using a typical IC process, the control circuit and the lateral power MOSFET can be integrated onto a monolithic power IC.

FIG. 1 shows a block diagram of a power converter. A transformer 200 is the load of a monolithic power IC 500. A LDMOS transistor 100 having a drain electrode 10, a source electrode 20 and a polysilicon gate electrode 40 is used to switch the transformer 200. A resistor 400 is utilized to sense a switching current $I_s$ of the LDMOS transistor 100 for power control. A controller 300 generates a control signal to drive the LDMOS transistor 100 for power conversion. In order to reduce the cost and optimize switching performance, the controller 300 and the LDMOS transistor 100 are implemented on the same substrate. The LDMOS process employing a reduced surface electric field (RESURF) technique using low thickness of EPI or N-well can achieve a high voltage with low on-resistance.

Recently, development of high-voltage LDMOS transistors have been proposed by Klas H. Eklund, in U.S. Pat. No. 4,811,075 entitled "High Voltage MOS Transistors"; by Vladimir Rumennik and Robert W. Busse, in U.S. Pat. No. 5,258,636 entitled "Narrow Radius Tips for High Voltage Semiconductor Devices with Interdigitated Source and Drain Electrodes"; However, the drawback of theses prior arts are that aforementioned LDMOS transistor have higher on-resistance. High voltage and low on-resistance LDMOS transistor, for example, are proposed by Klas H. Eklind, in U.S. Pat. No. 5,313,082 entitled "High Voltage MOS Transistor with a Low On-Resistance"; by Gen Tada, Akio Kitamura, Masaru Saito, and Naoto Fujishima, in U.S. Pat. No. 6,525,390 B2 entitled "MIS Semicondiictor Device with Low On Resistance and High Breakdown Voltage"; by Vladimir Rumennik, Donald R. Disney, and Janardhanan S. Ajit, in U.S. Pat. No. 6,570,219 B1 entitled "High-voltage Transistor with Multi-layer Conductor Region"; by Masaaki Noda, in U.S. Pat. No. 6,617,652 B2 entitled "High Breakdown Voltage Semiconductor Device". Although a high voltage and low on-resistance LDMOS transistor can be manufactured, the complexity of the production processes increases the production cost and/or reduces the production yield. Another disadvantage of these proposed transistors is none-isolated source structure. A none-isolated transistor current could flow around the substrate. This may generate noise interference in the control circuit 300. Besides, the switching current $I_s$ of the LDMOS transistor 100 can generate a ground bounce to disturb the control circuit 300. Furthermore, only an isolated LDMOS transistor can restrict the current flow. Therefore the switching current $I_s$ through the resistor 400 can be accurately measured. In order to solve these problems, the present invention proposes a LDMOS structure to achieve a high breakdown voltage, low on-resistance and isolated transistor for the monolithic integration.

SUMMARY OF THE INVENTION

An isolated high voltage LDMOS transistor according to the present invention includes a P-substrate. The LDMOS transistor also includes a first diffusion region and a second diffusion region having N conductivity-type ions to form an N-well in the P-substrate. The first diffusion region further comprises an extended drain region. A drain diffusion region having N+ conductivity-type ions forms a drain region. The drain region is formed in the extended drain region. A third diffusion region containing P conductivity-type ions forms a P-field and a plurality of divided P-fields located in the extended drain region. The divided P-fields are located nearer to the drain region than the P-field. A source diffusion region having N+ conductivity-type ions forms a source region. A contact diffusion region containing P+ conductivity-type ions forms a contact region. A fourth diffusion region containing P conductivity-type ions forms an isolated P-well for preventing from breakdown. The isolated P-well located in the second diffusion region encloses the source region and the contact region. The P-field and the divided P-fields located in the extended drain region of the N-well form junction-fields in the N-well to deplete a drift region. A channel is thus developed between the source region and the drain region extending through the N-well. The divided P-fields reduce the on-resistance of the channel. A polysilicon gate electrode is disposed above the channel to control a current flow in the channel. Furthermore, the portion of the N-well generated by the second diffusion region provides a low-impedance path for the source region to restrict the current flow in between the drain region and the source region.

It is to be understood that both the foregoing general descriptions and the following detailed descriptions are exemplary, and are intended to provide further explanation of the invention as claimed. Still further objects and advantages will become apparent from a consideration of the ensuing description and drawings.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

DESCRIPTION OF THE PREFERRED EMBODIMENTS

Figure 1:
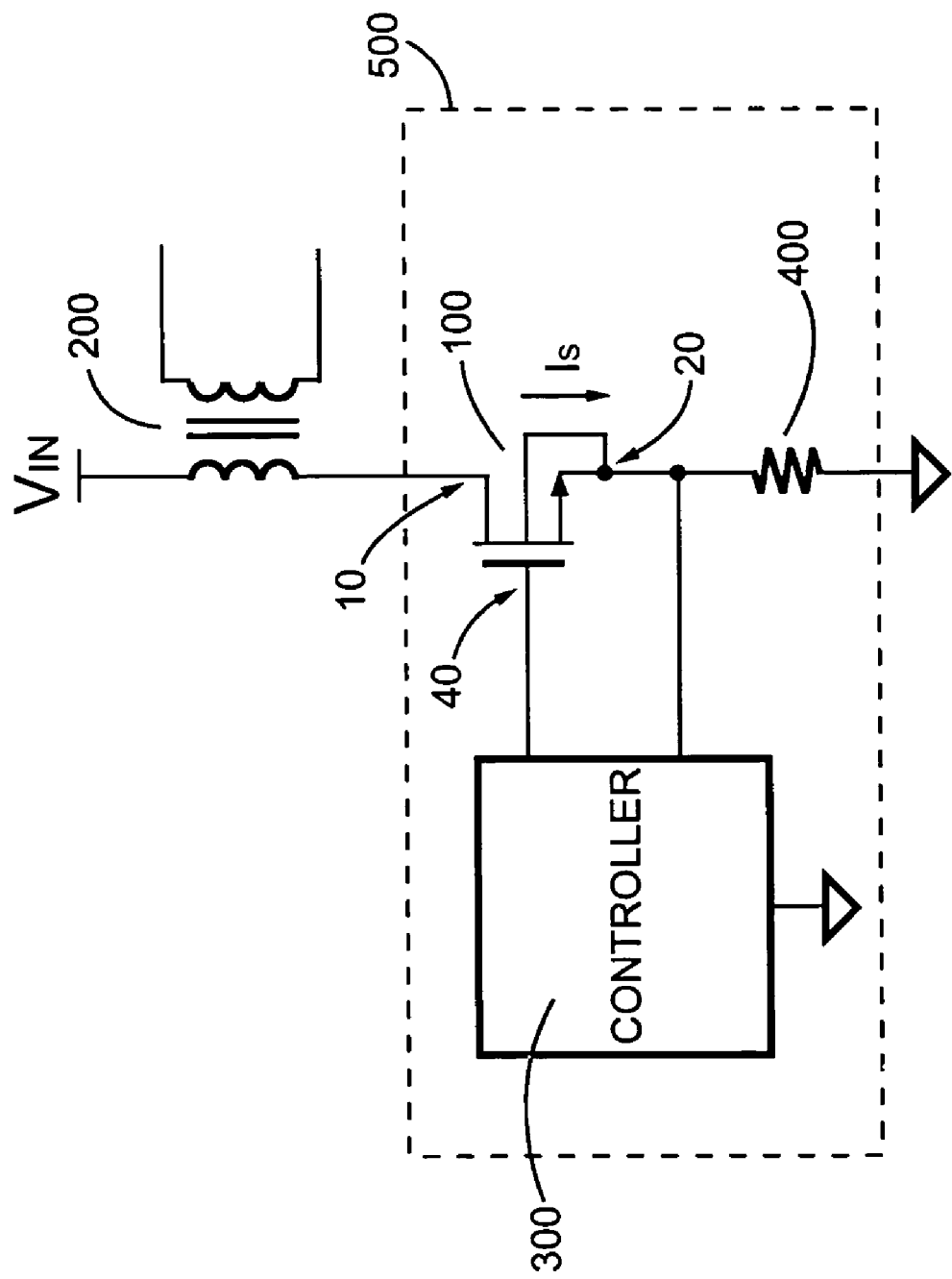
FIG. 1 shows a block schematic of a power converter.
Figure 2:
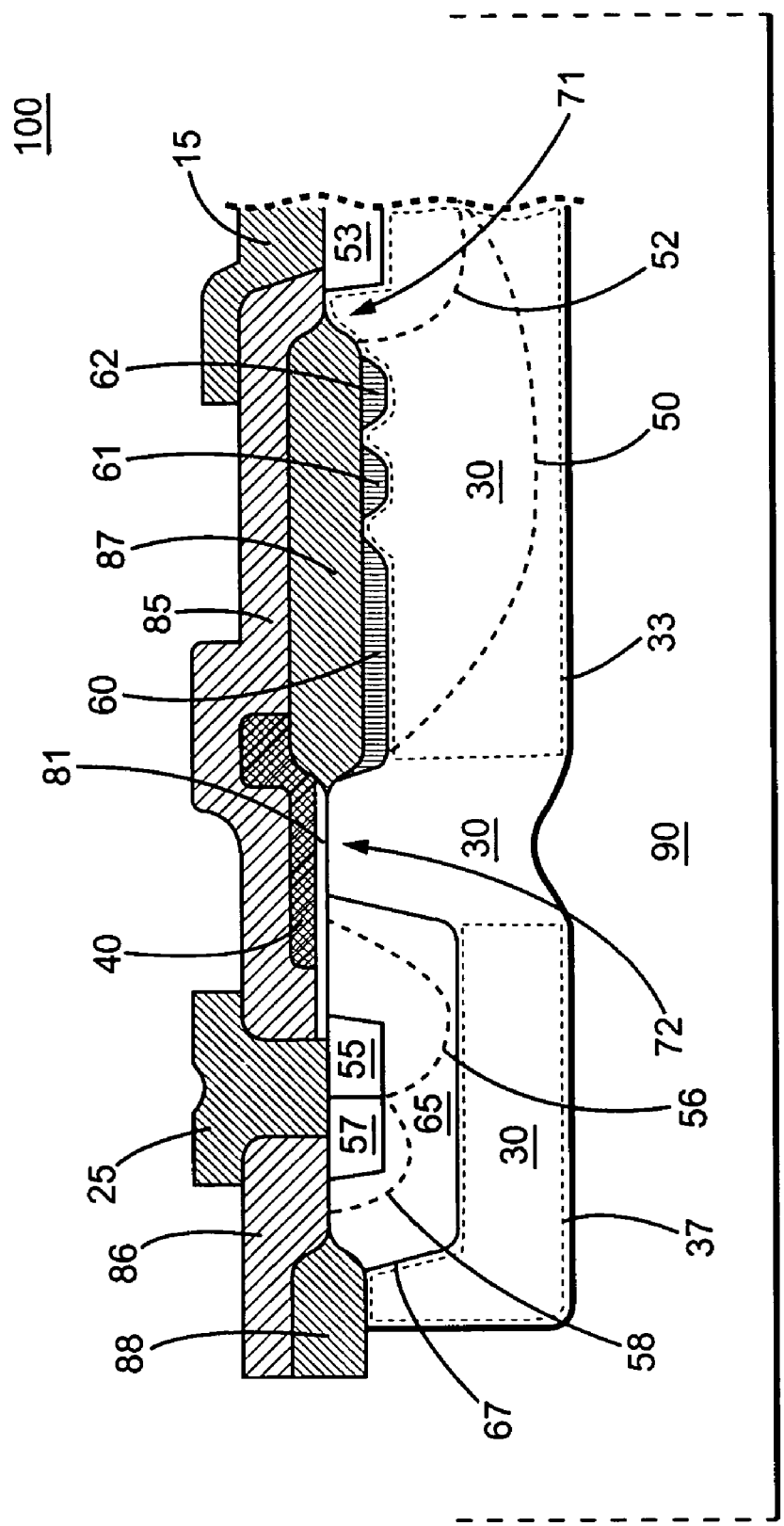
FIG. 2 is a cross-sectional view of a LDMOS transistor according to a preferred embodiment of the present invention.

FIG. 2 is a cross-sectional view of an LDMOS transistor 100. The LDMOS transistor 100 includes a P-substrate 90.

The LDMOS transistor 100 further includes a first diffusion region 33 and a second diffusion region 37 containing N conductivity-type ions to form an N-well 30 with an ion-doped concentration of $5E15/cm^{-3} \sim 5E16/cm^{-3}$ in the P-substrate 90. The first diffusion region 33 further comprises an extended drain region 50 with an ion-doped concentration of $5E15/cm^{-3} \sim 5E16/cm^{-3}$. A drain diffusion region 53 having N+ conductivity-type ions concentration of $5E19/cm^{-3} \sim 5E20/cm^{-3}$ in the N-well 30 formed in the first diffusion region 33, develops a drain region 52 with a boundary ion-doped concentration of $5E15/cm^{-3} \sim 5E16/cm^{-3}$ in the extended drain region 50. A third diffusion region containing P conductivity-type ions forms a P-field 60, divided P-fields 61 and 62 located in the extended drain region 50. The divided P-fields 61 and 62 are nearer to the drain region 52 than the P-field 60. A fourth diffusion region 67 containing P conductivity-type ions in the N-well 30 formed by the second diffusion region 37, develops an isolated P-well 65 for preventing from breakdown. Furthermore, it is well known in the semiconductor manufacturing field that after thermal diffusion of implanted ions, it can make a left edge of the first diffusion region 33 touch a right edge of the second diffusion region 37, which is the source-gap 72 having an ion-doped concentration of $5E14/cm^{-3} \sim 5E15/cm^{-3}$. A source diffusion region 55 having N+ conductivity-type ion concentration of $5E19/cm^{-3} \sim 5E20/cm^{-3}$ develops a source region 56 with a boundary ion-doped concentration of $1E16/cm^{-3} \sim 1E17/cm^{-3}$ in the P well 65. A contact diffusion region 57 containing P+ conductivity-type ions concentration of $5E19/cm^{-3} \sim 5E20/cm^{-3}$ in the N-well 30 formed by the second diffusion region 37, develops a contact region 58. The P-field 60, the divided P-fields 61 and 62 form junction-fields in the N-well 30 to deplete a drift region.

A channel is developed between the source region 56 and the drain region 52 extending through the N-well 30. The divided P-fields 61 and 62 are further capable of reducing the on-resistance of the channel. A thin gate oxide 81 and a thick field oxide 87 are formed over the P-substrate 90. A polysilicon gate electrode 40 is disposed above the portion of the gate oxide 81 and the field oxide 87 to control a current flow in the channel. A drain-gap 71 is formed between the drain diffusion region 53 and the field oxide 87 to maintain a space between the drain diffusion region 53 and the field oxide 87. A source-gap 72 is formed between the field oxide 87 and the isolated P-well 65 to maintain a space between the field oxide 87 and the isolated P-well 65. Proper placement of the drain-gap 71 and the source-gap 72 can substantially increase the breakdown voltage of the LDMOS transistor 100. The drain-gap 71 can further reduce the on-resistance of the channel.

Insulation layers 85 and 86 cover the polysilicon gate 40, the field oxide 87 and a field oxide 88. The insulation layers 85 and 86 are, for example, made of silicon dioxide. A drain metal contact 15 is a metal electrode for contacting with the drain diffusion region 53. A source metal contact 25 is a metal electrode for contacting with the source diffusion region 55 and the contact diffusion region 57.

Figure 3:
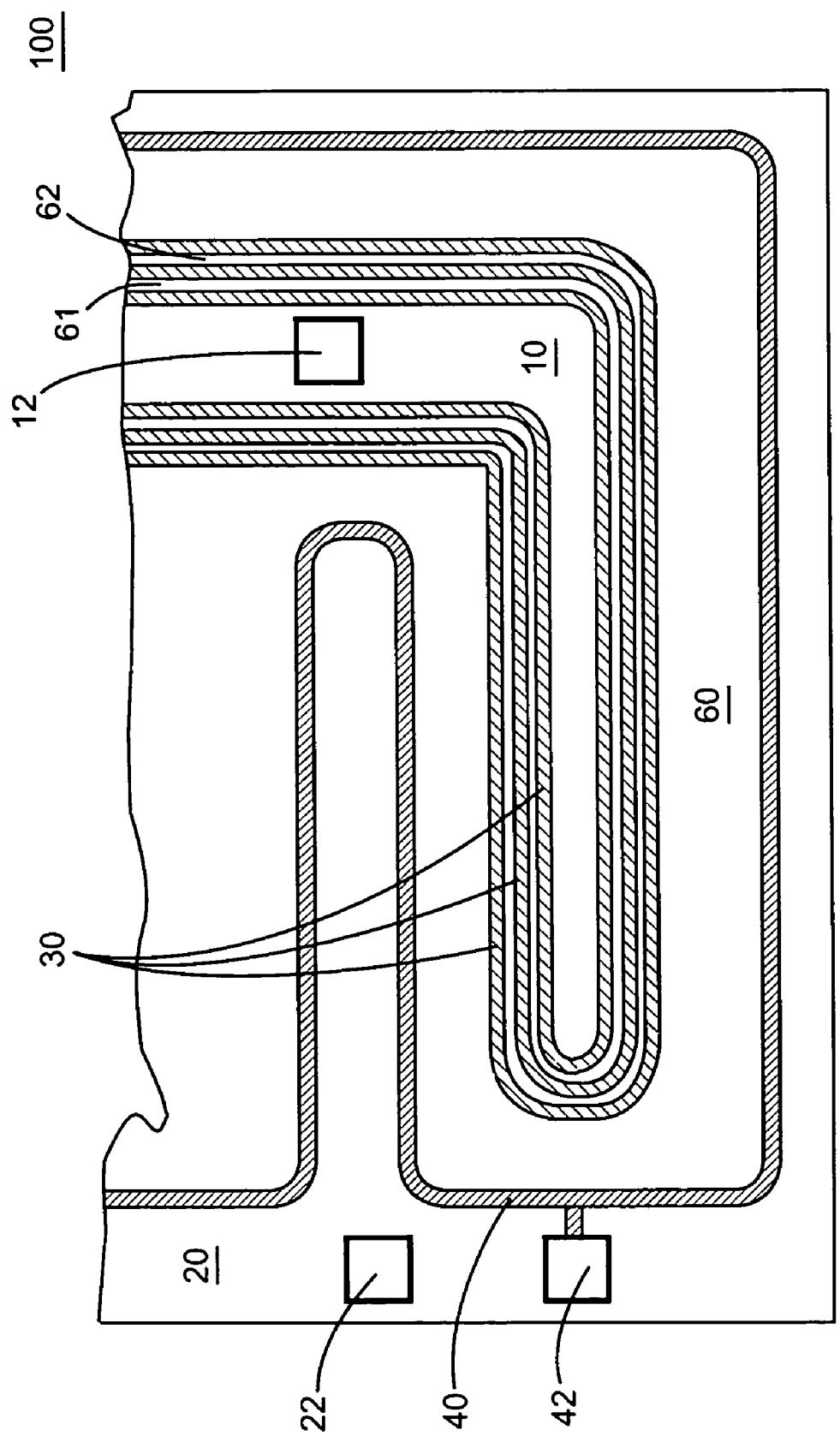
FIG. 3 shows a top view of the LDMOS transistor shown in FIG. 2.

FIG. 3 is a top view of proposed LDMOS transistor 100 shown in FIG. 2. The LDMOS transistor 100 includes a drain electrode 10, a source electrode 20, the polysilicon gate electrode 40, a bonding pad 12 for the drain electrode 10, a bonding pad 22 for the source electrode 20, a bonding pad 42 for the polysilicon gate electrode 40.

Referring to FIG. 2 and FIG. 3, the extended drain region 50 and the drain diffusion region 53 forms the drain electrode 10. The isolated P-well 65, the source diffusion region 55 and the contact diffusion region 57 form the source electrode 20. The bonding pad 12 is connected to the drain metal contact 15 for the drain electrode 10. The bonding pad 22 is connected to the source metal contact 25 for the source electrode 20. The bonding pad 42 is connected to the polysilicon gate electrode 40. The N-well 30 beneath the P-field 60 and divided P-fields 61 and 62 are connected from the drain electrode 10 to the source electrode 20. The portion of the N-well 30 in between the divided P-fields 61 and 62 reduces the on-resistance of the channel.

The P-field 60 and the divided P-fields 61 and 62 located in the extended drain region 50 form a junction-field in the N-well 30. The N-well 30, the P-field 60, and the divided P-fields 61 and 62 deplete the drift region, which build the electrical field in the N-well 30 and help to increase the breakdown voltage. In order to get a high breakdown voltage the extended drain region 50 must be fully depleted before breakdown occurs. The N-well 30, P-fields 60, and divided P-fields 61 and 62 enable the extended drain region 50 to be depleted before breakdown occurs even though the doping density of the drift region is high. This allows the drift region to have higher doping density and accomplish low resistance.

Figure 4:
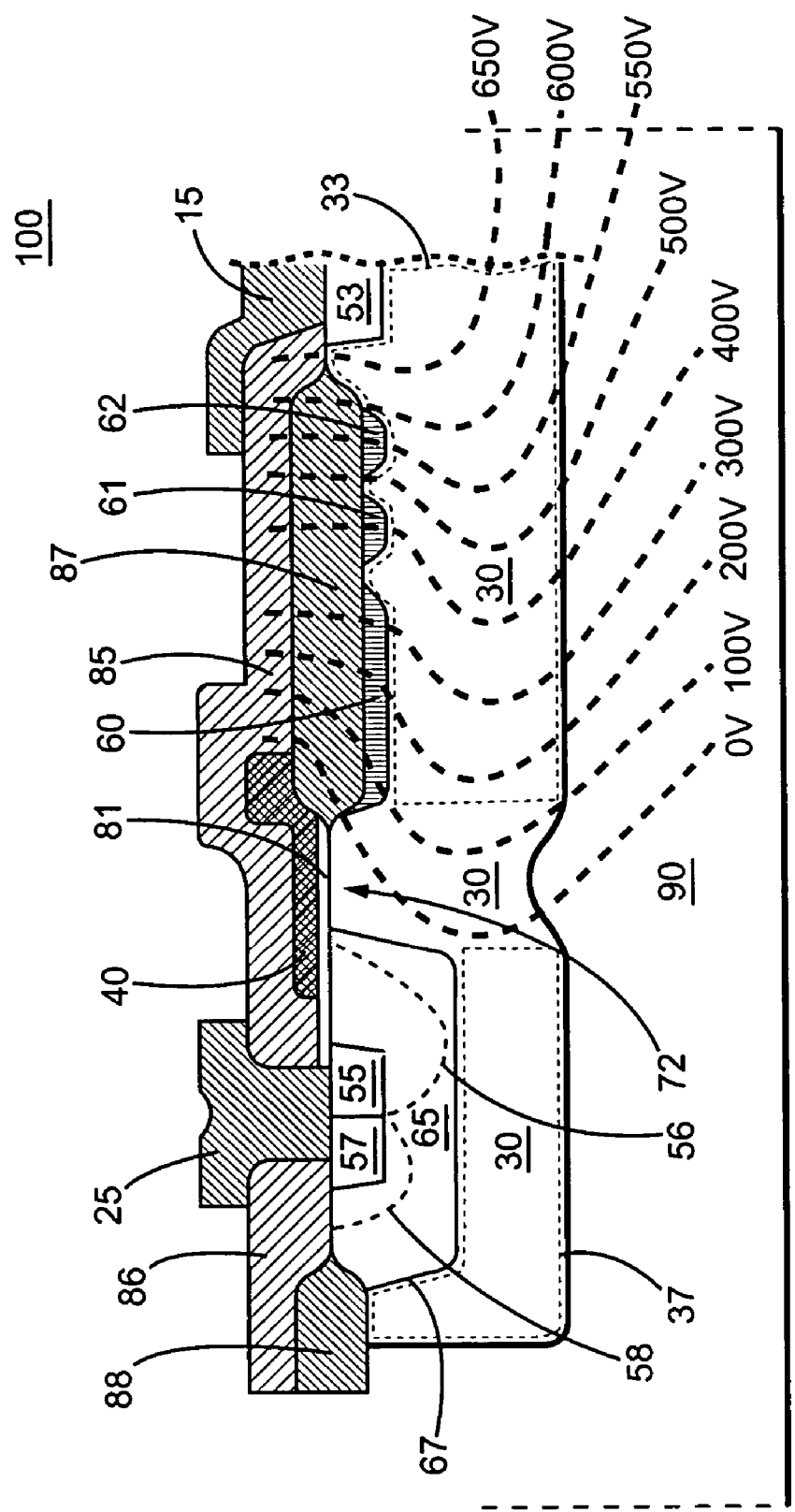
FIG. 4 shows the electrical field distribution when a 650 V voltage is applied to a drain region of the LDMOS transistor according to a preferred embodiment of the present invention.

FIG. 4 shows the electrical field distribution when a 650 V voltage is applied to the drain region 52 of the LDMOS transistor 100. The bold dotted lines respectively indicate the potential voltages of 0 V, 100 V, 200 V, 300 V, 400 V, 500 V, 550 V, 600 V and 650 V.

Furthermore, the portion of the N-well 30 generated by the second diffusion region 37 provides a low-impedance path for the source region 56, which restricts the transistor current flow from flowing in between the drain region 52 and the source region 56.

The LDMOS transistor 100 of the present invention uses a simple structure to implement high breakdown voltage, low on-resistance and isolated performance. Furthermore, the cost is reduced and the production yield can be greatly raised.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. A transistor comprising:
   a P-substrate;
   a first diffusion region and a second diffusion region formed in said P-substrate; wherein said first diffusion region and said second diffusion containing N conductivity-type ions form an N-well in said P-substrate; wherein said first diffusion region comprises an extended drain region;
   a drain diffusion region containing N+ conductivity-type ions, forming a drain region in said extended drain region;
   a third diffusion region containing P conductivity-type ions, comprising a P-field and divided P-fields formed in said extended drain region;
   a fourth diffusion region containing P conductivity-type ions, forming an isolated P-well in said N-well formed by said second diffusion region for preventing N-well's breakdown;
   a source diffusion region having N+ conductivity-type ions, forming a source region in said N-well formed by said second diffusion region;

a channel, formed between said source region and said drain region;

a thin gate oxide layer, formed over said channel;

a polysilicon gate electrode, formed over said channel to control a current flow in said channel;

a contact diffusion region containing P+ conductivity-type ions, forming a contact region in said N-well formed by said second diffusion region;

a thick field oxide, formed laterally adjacent to said thin gate oxide layer;

a drain-gap, formed between said drain diffusion region and said thick field oxide to maintain a space between said drain diffusion region and said thick field oxide;

a source-gap, formed between said thick field oxide and said isolated P-well to maintain a space between said thick field oxide and said isolated P-well;

an insulation layer, covering said polysilicon gate electrode and said thick field oxide;

a drain metal contact, having a first metal electrode for contacting with said drain diffusion region; and a source metal contact, having a second metal electrode for contacting with said source diffusion region and said contact diffusion region; wherein a left edge of the first diffusion region touches a right edge of the fourth diffusion region, said divided P-fields are located nearer to said drain region compared to said P-field, and said P-field and said divided P-fields generate junction fields.

2. The transistor of claim 1, wherein said N-well formed by said second diffusion region provides a low-impedance path for said source region and restricts a transistor current flow in between said drain region and said source region.

3. The transistor of claim 1, further comprising:

a drain bonding pad, for connecting to said drain metal contact for a drain electrode;

a source bonding pad, for connecting to said source metal contact for a source electrode; and a gate bonding pad, for connecting to said polysilicon gate electrode.

4. The transistor of claim 1, wherein said P-field and said divided P-fields form junction-fields in said N-well to deplete a drift region.

5. The transistor of claim 1, wherein the N-well has an ion-doped concentration ranging from $5E15/cm^{-3}$ to $E16/cm^{-3}$.

6. The transistor of claim 1, wherein the extended drain region has an ion-doped concentration ranging from $5E15/cm^{-3}$ to $5E16/cm^{-3}$.

7. The transistor of claim 1, wherein the drain diffusion region has an ion-doped concentration ranging from $5E19/cm^{-3}$ to $5E20/cm^{-3}$.

8. The transistor of claim 1, wherein the drain region has an ion-doped concentration ranging from $5E15/cm^{-3}$ to $5E16/cm^{-3}$.

9. The transistor of claim 1, wherein the source-gap has an ion-doped concentration ranging from $5E14/cm^{-3}$ to $5E15/cm^{-3}$.

10. The transistor of claim 1, wherein the source diffusion region has an ion-doped concentration ranging from $5E19/cm^{-3}$ to $5E20/cm^{-3}$.

11. The transistor of claim 1, wherein the source region has an ion-doped concentration ranging from $1E16/cm^{-3}$ to $1E17/cm^{-3}$.

12. The transistor of claim 1, wherein the contact diffusion region has an ion-doped concentration ranging from $5E19/cm^{-3}$ to $5E20/cm^{-3}$.

* * * * *